United States Patent
Richter et al.

(10) Patent No.: US 9,773,956 B2
(45) Date of Patent: Sep. 26, 2017

(54) METHOD OF PRODUCING A CONVERSION ELEMENT

(71) Applicant: OSRAM Opto Semiconductors GmbH, Regensburg (DE)

(72) Inventors: Markus Richter, Burglengenfeld (DE); Markus Burger, Regensburg (DE)

(73) Assignee: OSRAM Opto Semiconductors GmbH (DE)

( * ) Notice: Subject to any disclaimer, the term of this patent is extended or adjusted under 35 U.S.C. 154(b) by 0 days.

(21) Appl. No.: 14/896,950

(22) PCT Filed: Jun. 6, 2014

(86) PCT No.: PCT/EP2014/061868
§ 371 (c)(1),
(2) Date: Dec. 9, 2015

(87) PCT Pub. No.: WO2014/202414
PCT Pub. Date: Dec. 24, 2014

(65) Prior Publication Data
US 2016/0133802 A1  May 12, 2016

(30) Foreign Application Priority Data

Jun. 20, 2013 (DE) .................. 10 2013 211 634

(51) Int. Cl.
*B05D 1/32* (2006.01)
*H01L 33/50* (2010.01)
*B05D 3/02* (2006.01)

(52) U.S. Cl.
CPC .............. *H01L 33/505* (2013.01); *B05D 1/32* (2013.01); *H01L 33/50* (2013.01); *B05D 1/322* (2013.01);

(Continued)

(58) Field of Classification Search
USPC .................................. 427/64, 74, 282, 421.1
See application file for complete search history.

(56) References Cited

U.S. PATENT DOCUMENTS 4,243,695 A * 1/1981 Wengert ................ H01J 9/2277
427/468
6,689,412 B1 * 2/2004 Bourrieres .......... H01L 21/4853
228/180.21

(Continued)

FOREIGN PATENT DOCUMENTS

DE  10 2009 035 100 A1  2/2011
EP  1 198 016 A2  4/2002

(Continued)

OTHER PUBLICATIONS

Notification for Reasons of Rejection dated Jan. 4, 2017, of corresponding Japanese Application No. 2016-520372 in English.

(Continued)

*Primary Examiner* — Brian K Talbot
(74) *Attorney, Agent, or Firm* — DLA Piper LLP (US)

(57) ABSTRACT

A method of producing a conversion element includes providing a substrate having a surface; forming a first mask structure above the surface, wherein the first mask structure has first webs and first openings arranged between the first webs and the first openings form cavities in which the surface of the substrate is accessible; arranging a second mask structure above the first mask structure, wherein the second mask structure has second webs and second openings arranged between the second webs, the first webs are at least partly covered by the second webs, and the cavities remain at least partly accessible through the second openings; spraying a material into the cavities through the second openings; removing the second mask structure; and removing the first mask structure.

10 Claims, 3 Drawing Sheets

(52) U.S. Cl.
CPC ........ *B05D 3/02* (2013.01); *H01L 2933/0041* (2013.01)

(56) References Cited

U.S. PATENT DOCUMENTS

| | | | |
|---|---|---|---|
| 7,282,240 B1* | 10/2007 | Jackman | B82Y 10/00 427/282 |
| 7,432,187 B1* | 10/2008 | Cok | B82Y 20/00 257/E31.099 |
| 8,399,268 B1 | 3/2013 | Mei et al. | |
| 8,546,159 B2* | 10/2013 | Yoo | H01L 33/505 427/157 |
| 2007/0215890 A1 | 9/2007 | Harbers et al. | |
| 2009/0087792 A1 | 4/2009 | Iizumi et al. | |
| 2009/0283769 A1 | 11/2009 | Park et al. | |
| 2009/0317934 A1* | 12/2009 | Scherff | H01L 31/02242 438/72 |
| 2010/0237775 A1* | 9/2010 | Chao | H01L 33/504 313/506 |
| 2012/0086028 A1 | 4/2012 | Beeson et al. | |
| 2013/0009307 A1* | 1/2013 | Lu | H01L 24/13 257/738 |
| 2013/0026610 A1* | 1/2013 | Panda | H01L 21/0273 257/635 |
| 2013/0140591 A1* | 6/2013 | Tseng | H01L 33/504 257/98 |
| 2013/0168703 A1 | 7/2013 | Mei et al. | |
| 2014/0167075 A1* | 6/2014 | Mei | H01L 33/50 257/88 |
| 2014/0339582 A1 | 11/2014 | Matsumura et al. | |

FOREIGN PATENT DOCUMENTS

| | | |
|---|---|---|
| JP | 2000-035678 | 2/2000 |
| JP | 2009-87760 | 4/2009 |
| JP | 2013-140965 | 7/2013 |
| WO | 2012/169289 | 12/2012 |

OTHER PUBLICATIONS

English translation of a First Office Action dated Mar. 7, 2017, of corresponding Chinese Patent Application No. 201480034907.8.

* cited by examiner

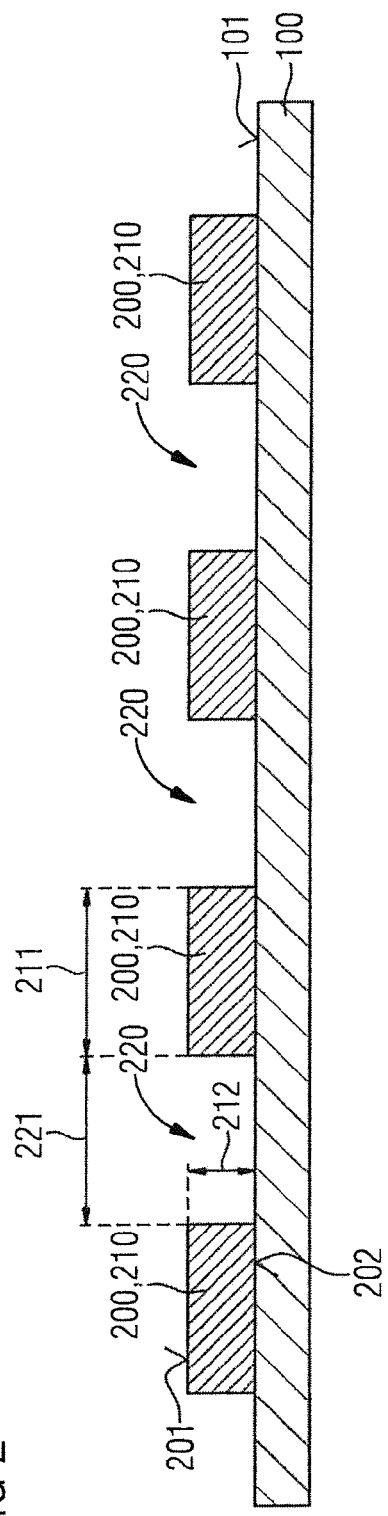

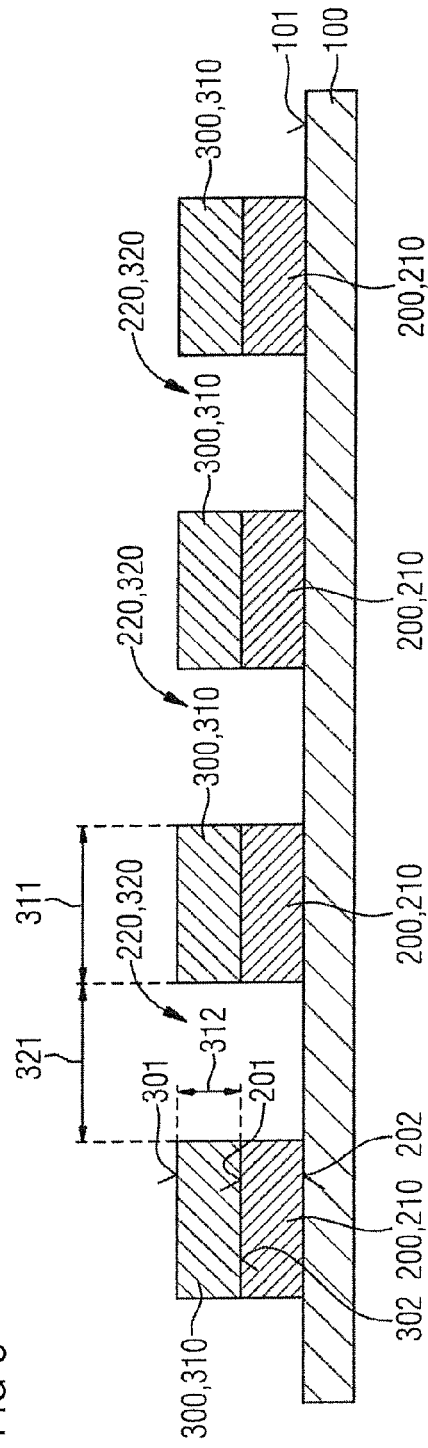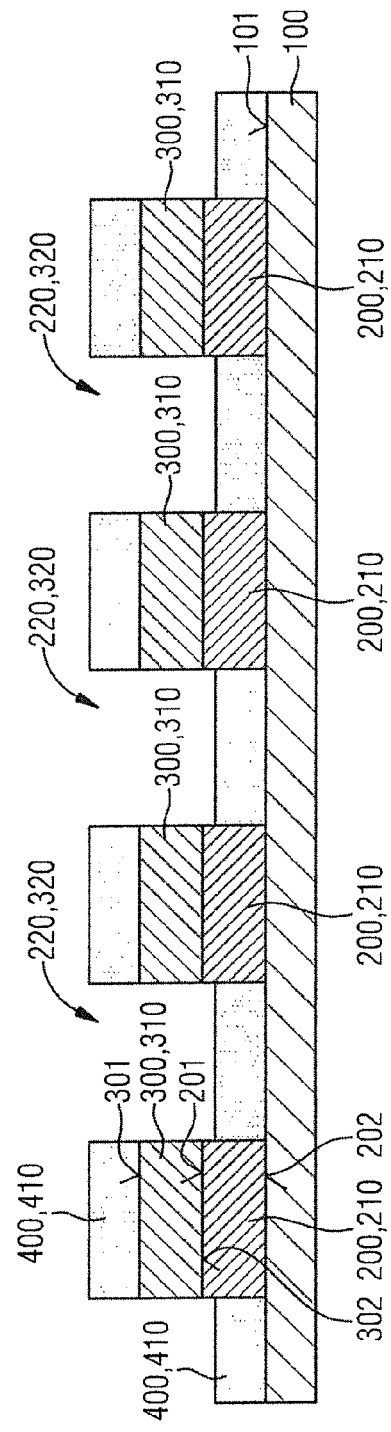

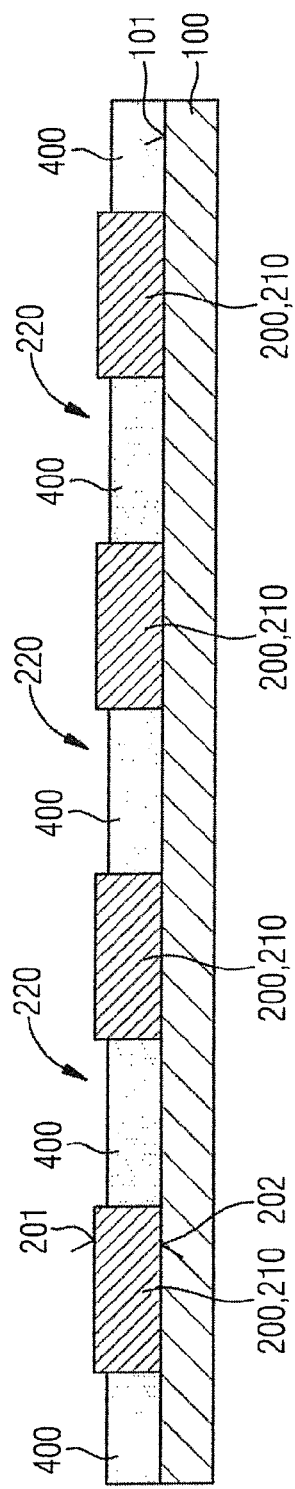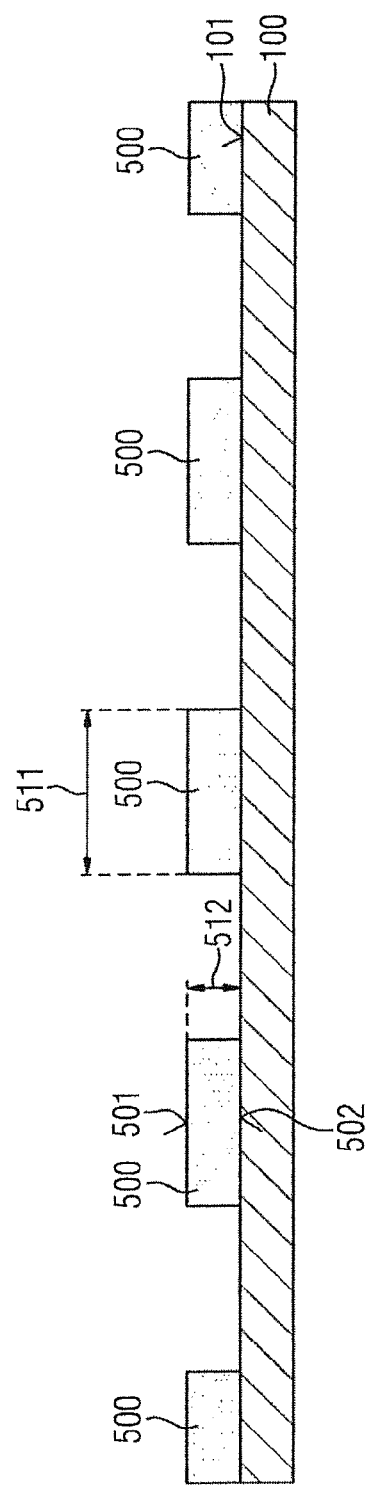

METHOD OF PRODUCING A CONVERSION ELEMENT

TECHNICAL FIELD

This disclosure relates to a method of producing a conversion element.

BACKGROUND

Optoelectronic components in which a light color is converted by a wavelength-converting conversion element are known. The conversion elements of such optoelectronic components comprise a phosphor designed to absorb electromagnetic radiation having a first wavelength and subsequently emit electromagnetic radiation having a second, typically longer, wavelength. Different phosphors that emit electromagnetic radiation having different wavelengths can also be combined with one another. By way of example, optoelectronic components comprising light emitting diode chips that emit in the blue spectral range are known in which blue light generated by the light emitting diode chip is converted into white light by a conversion element.

It is known to form such conversion elements as laminae that can be arranged above light emitting surfaces of optoelectronic semiconductor chips. Producing conversion laminae by screen printing methods is also known. However, the conversion elements obtainable thereby have comparatively large shape tolerances. It is likewise known to realize conversion elements as stamped ceramic laminae. However, this is associated with high production costs.

It could therefore be helpful to provide an improved method of producing a conversion element.

SUMMARY

We provide a method of producing a conversion element including providing a substrate having a surface; forming a first mask structure above the surface, wherein the first mask structure has first webs and first openings arranged between the first webs and the first openings form cavities in which the surface of the substrate is accessible; arranging a second mask structure above the first mask structure, wherein the second mask structure has second webs and second openings arranged between the second webs, the first webs are at least partly covered by the second webs, and the cavities remain at least partly accessible through the second openings; spraying a material into the cavities through the second openings; removing the second mask structure; and removing the first mask structure.

BRIEF DESCRIPTION OF THE DRAWINGS

FIG. 1 shows a section through a substrate having a surface.

FIG. 2 shows a section through the substrate and a first mask structure arranged at the surface.

FIG. 3 shows a section through the substrate, the first mask structure and a second mask structure.

FIG. 4 shows a section through the substrate and the mask structures with a material sprayed into openings of the mask structures.

FIG. 5 shows a section through the substrate and the first mask structure after removal of the second mask structure.

FIG. 6 shows a section through the substrate with conversion elements arranged on the surface after the removal of the first mask structure.

LIST OF REFERENCE SIGNS

100 Substrate
101 Surface
200 First mask structure
201 Top side
202 Underside
210 First web
211 First width
212 First height
220 First opening
221 First diameter
300 Second mask structure
301 Top side
302 Underside
310 Second web
311 Second width
312 Second height
320 Second opening
321 Second diameter
400 Converter material
410 Wavelength-converting phosphor
500 Conversion element
501 Top side
502 Underside
511 Third diameter
512 Third height

DETAILED DESCRIPTION

A method of producing a conversion element comprises steps of providing a substrate having a surface to form a first mask structure above the surface, wherein the first mask structure has first webs and first openings arranged between the first webs, wherein the first openings form cavities in which the surface of the substrate is accessible, to arrange a second mask structure above the first mask structure, wherein the second mask structure has second webs and second openings arranged between the second webs, wherein the first webs are at least partly covered by the second webs, wherein the cavities remain at least partly accessible through the second openings, to spray a material into the cavities through the second openings, to remove the second mask structure, and to remove the first mask structure. This method advantageously enables cost-effective parallel production of a multiplicity of conversion elements. In this case, the conversion elements are advantageously formed with a precise and accurately defined shape, in particular with sharp edges. Forming the conversion elements from a material sprayed on advantageously affords greater freedom in choosing the composition of the material as a result of which the production of conversion elements for different color ranges is made possible.

After spraying the material into the cavities, a further step may be carried out to cure the material sprayed into the cavities. Advantageously, the conversion elements formed from the material sprayed into the cavities during curing of the material thereby acquire with high accuracy the shapes defined by the first openings arranged between the first webs of the first mask structure as a result of which conversion elements having high shape accuracy are advantageously obtainable.

Curing the material sprayed into the cavities may be carried out by a thermal method. Advantageously, the method can thereby be cost-effectively carried out and with good reproducibility.

Curing the material sprayed into the cavities may be carried out between removing the second mask structure and removing the first mask structure. Advantageously, the first mask structure is exposed after removal of the second mask structure and can thereby be removed after curing the material sprayed into the cavities without the conversion elements formed from the cured material being damaged.

The material sprayed into the cavities may form conversion elements. In this case, the method comprises a further step of detaching the conversion elements from the surface of the substrate. Advantageously, the conversion elements can then subsequently be brought to their target position. By way of example, the conversion elements can be arranged above light emitting surfaces of optoelectronic semiconductor chips to form optoelectronic components.

Detaching the conversion elements may be carried out by a transfer adhesive bonding process. By way of example, a thermo release film can be used in this case. Advantageously, the conversion elements formed from the material sprayed into the cavities can in this case be transferred directly from the surface of the substrate to their target position. However, intermediate storage of the conversion elements is also possible.

The material sprayed into the cavities may comprise a wavelength-converting phosphor. Advantageously, the conversion elements formed from the material sprayed into the cavities are then suitable to convert electromagnetic radiation having a first wavelength into electromagnetic radiation having a second wavelength.

The first mask structure may be formed from a resist. In this case, the first mask structure can be patterned according to a photolithographic method, for example. Advantageously, this enables a flexible configuration of the first mask structure with high accuracy and reproducibility.

Removing the first mask structure may be carried out by dissolving the first mask structure by a solvent. Advantageously, after the first mask structure has been dissolved, only the conversion elements formed from the material sprayed into the cavities remain at the surface of the substrate.

The first mask structure may comprise a plastics material or a metal. Advantageously, the first mask structure can then be formed by simple placement on the surface of the substrate.

Removing the first mask structure may be carried out by pulling off. Advantageously, the method can thereby be carried out in a particularly simple and time-saving manner.

The second mask structure may comprise a metal. Advantageously, the second mask structure can then be reused in a repetition of the method after removal of the second mask structure.

The above-described properties, features and advantages and the way in which they are achieved will become clearer and more clearly understood in association with the following description of the examples explained in greater detail in association with the drawings.

FIG. 1 shows a schematic sectional view of a substrate 100. The substrate 100 has a substantially planar surface 101. In a lateral direction, the surface 101 of the substrate 100 can have, for example, a rectangular shape or a shape in the form of a circular disk. The substrate 100 can comprise a metal or a plastics material, for example. The surface 101 of the substrate 100 can also be formed by an adhesive film.

FIG. 2 shows a further schematic sectional illustration of the substrate 100 in a processing state temporally succeeding the illustration in FIG. 1. A first mask structure 200 has been formed on the surface 101 of the substrate 100. The first mask structure 200 has a top side 201 and an underside 202 opposite the top side 201. The underside 202 of the first mask structure 200 faces the surface 101 of the substrate 100.

The first mask structure 200 has first webs 210 between which first openings 220 are formed. In the regions of the first openings 220, the surface 101 of the substrate 100 is accessible and not covered. The first webs 210 can form, for example, a lattice in particular, for example, a rectangular lattice in a lateral direction at the surface 101 of the substrate 100. In this case, the first openings 220 are formed in rectangular fashion between the first webs 210 in a lateral direction. The first openings 220 of the first mask structure 200 delimited by the first webs 210 form cavities.

The first webs 210 of the first mask structure 200 have a first width 211 in a lateral direction (that is to say in a direction parallel to the plane of the surface 101 of the substrate 100). The first webs 210 of the first mask structure 200 have a first height 212 in a direction perpendicular to the surface 101 of the substrate 100. The first width 211 can be, for example, 10 μm to 1 mm or more. The first height 212 can be, for example, 10 μm to 500 μm. Between two adjacent first webs 210, each first opening 212 has a first diameter 221. The first diameter 221 can be, for example, 500 μm to 3 mm.

The first mask structure 200 can comprise, for example, a polyvinyl acetate resist (PVA resist), a photoresist, a plastics material or a metal. The first mask structure 200 may have been arranged and patterned at the surface 101 of the substrate 100 according to a photolithographic method, for example, to form the first webs 210 and the first openings 220 arranged between the first webs 210. However, the first mask structure 200 may also already have been patterned prior to the arrangement of the first mask structure 200 on the surface 101 of the substrate 100 and have been arranged in patterned form on the surface 101 of the substrate 100.

FIG. 3 shows a schematic sectional illustration of the substrate 100 and of the first mask structure 200 in a processing state temporally succeeding the illustration in FIG. 2. A second mask structure 300 has been arranged above the first mask structure 200. The second mask structure 300 has a top side 301 and an underside 302 opposite the top side 301. The underside 302 of the mask structure 300 faces the top side 201 of the first mask structure 200.

The second mask structure 300 has second webs 310, between which second openings 320 are formed. Preferably, the second mask structure 300 is formed similarly or identically to the first mask structure 200. The second webs 310 of the second mask structure 300 are arranged above the first webs 210 of the first mask structure 200 such that the first webs 210 of the first mask structure 200 are at least partly covered by the second webs 310 of the second mask structure 300. The second openings 320 of the second mask structure 300 are arranged above the first openings 220 of the first mask structure 200 such that the first openings 220 of the first mask structure 200 are at least partly accessible through the second openings 320 of the second mask structure 300.

The second webs 310 of the second mask structure 300 have a second width 311 in a lateral direction parallel to the surface 101 of the substrate 100. The second webs 310 of the second mask structure 300 have a second height 312 in a direction perpendicular to the surface 101 of the substrate 100. The second openings 320 of the second mask structure 300 have a second diameter 321 in a lateral direction parallel to the surface 101 of the substrate 100. The second width 311 of the second webs 310 preferably approximately corresponds to the first width 211 of the first webs 210 of the first mask structure 200. The second diameter 321 of the second openings 320 of the second mask structure 300 preferably approximately corresponds to the first diameter 221 of the first openings 220 of the first mask structure 200. The second height 312 of the second webs 310 of the second mask structure 300 can also approximately correspond to the first height 212 of the first webs 210 of the first mask structure 200, but can also be chosen to be smaller or larger.

The second mask structure 300 was already patterned prior to the arrangement of the second mask structure 300 above the first mask structure 200. The second mask structure 300 can comprise a metal, for example. By way of example, the second mask structure 300 can be a metal lattice or metal net. The prepatterned second mask structure 300 was preferably arranged by placement above the first mask structure 200. Preferably, the second mask structure 300 was subsequently additionally fixed in a releasable manner above the first mask structure 200.

FIG. 4 shows a further schematic sectional illustration of the substrate 100 and of the mask structures 200, 300 arranged above the substrate 100 in a processing state temporally succeeding the illustration in FIG. 3.

Through the second openings 320 of the second mask structure 300, a converter material 400 has been sprayed into the cavities formed by the first openings 220 of the first mask structure 200. In this case, the converter material 400 has been sprayed from above the top side 301 of the second mask structure 300 in the direction of the substrate 100.

Parts of the converter material 400 have passed through the second openings 320 of the second mask structure 300 into the cavities formed by the first openings 220 of the first mask structure 200 and adhere to the surface 101 of the substrate 100 in the region of the cavities formed by the first openings 220 of the first mask structure 200. Other parts of the converter material 400 adhere to the top side 201 of the second webs 310 of the second mask structure 300. The parts of the converter material 400 which adhere to the surface 101 of the substrate 100 can be connected to or separated from the parts of the converter material 400 which adhere to the top side 301 of the second webs 310 of the second mask structure 300. In the region of the cavities formed by the first openings 220 of the first mask structure 200, the converter material 400 preferably forms planar films or laminae which preferably substantially completely fill the first openings 220 of the first mask structure 200 in a lateral direction.

The converter material 400 comprises a wavelength-converting phosphor 410. The wavelength-converting phosphor 410 can be, for example, in the form of particles embedded into the converter material 400. The wavelength-converting phosphor 410 absorbs electromagnetic radiation (for example, visible light) having a wavelength from a first spectral range and then to emit electromagnetic radiation having a wavelength from a different spectral range, for example, in the form of visible light having a different light color. The wavelength-converting phosphor 410 can also be designed to emit electromagnetic radiation having a plurality of different wavelengths. The wavelength-converting phosphor 410 can be, for example, an organic or an inorganic phosphor. The wavelength-converting phosphor 410 can also comprise quantum dots.

FIG. 5 shows a further schematic sectional illustration of the substrate 100 with the first mask structure 200 and the sprayed-on converter material 400 in a processing state temporally succeeding the illustration in the figure. The second mask structure 300 has been removed from the top side 201 of the first mask structure 200. In this case, that part of the converter material 400 that had been deposited on the top side 301 of the second mask structure 300 has also been removed. That part of the converter material 400 arranged in the first openings 220 between the first webs 210 of the first mask structure 200 on the surface 101 of the substrate 100 has remained in the cavities formed by the first opening 220 of the first mask structure 200.

Removal of the second mask structure 300 may have been carried out, for example, by simple lift-off or pulling-off of the second mask structure 300 from the top side 201 of the first mask structure 200. A possible fixing of the second mask structure 300 relative to the first mask structure 200 was released beforehand in this case.

After removal of the second mask structure 300, the converter material 400 arranged in the cavities formed by the first opening 220 of the first mask structure 200 can be cured. Curing the converter material 400 can be carried out by a thermal method, for example. For this purpose, the substrate 100 with the first mask structure 200 and the converter material 400 arranged in the cavities formed by the first openings 220 can be heated in a furnace, for example. However, the converter material 400 can also be cured, for example, by irradiation of the converter material 400 or by a chemical treatment of the converter material 400. During curing, conversion elements 500 are formed from the converter material 400 arranged in the cavities formed by the first openings 220 of the first mask structure 200.

FIG. 6 shows a schematic sectional illustration of the substrate 100 with the conversion elements 500 arranged on the surface 101 of the substrate 100 in a processing state temporally succeeding the illustration in FIG. 5. The first mask structure 200 has been removed from the surface 101 of the substrate 100. The removal of the first mask structure 200 may have been carried out, for example, by pulling off the first mask structure 200 or dissolving the first mask structure 200 by a solvent.

After removal of the first mask structure 200, the conversion elements 500 produced as a result of curing the converter material 400 have remained on the surface 101 of the substrate 100. Each conversion element 500 has a top side 501 and an underside 502 opposite the top side 501. The underside 502 of each conversion element 500 faces the surface 101 of the substrate 100.

Each conversion element 500 has a third diameter 511 in a lateral direction parallel to the surface 101 of the substrate 100. Each conversion element 500 has a third height 512 in a direction perpendicular to the surface 101 of the substrate 100. The third diameter 511 of the conversion elements 500 approximately corresponds to the first diameter 221 of the first openings 220 of the first mask structure 200 and can thus be 500 µm to 3 mm, for example. The third height 512 of the conversion elements 500 is preferably somewhat smaller than the first height 212 of the first webs 210 of the first mask structure 200 and can be 30 µm to 150 µm, for example.

The conversion elements 500 formed from the converter material 400 comprise the embedded wavelength-converting phosphor 410. As a result, the conversion elements 500 absorbs electromagnetic radiation having a wavelength from a first spectral range and to emit electromagnetic radiation having a different wavelength. The conversion elements 500 can be used, for example, as conversion elements in optoelectronic components, for example, in light emitting diode components.

For further processing, the conversion elements 500 can be detached from the surface 101 of the substrate 100.

Detachment of the conversion elements 500 from the surface 101 of the substrate 100 can be carried out by a transfer adhesive bonding process, for example. In this case, a thermo release film forming the surface 101 of the substrate 100 can be used, for example. By a transfer adhesive bonding process, the conversion elements 500 can be transferred, for example, directly to their target position at or in optoelectronic components.

One advantage of the method of producing the conversion elements 500 as explained with reference to FIGS. 1-6 is that the conversion elements 500 can have sharp edges. This is achieved by virtue of the fact that the converter material 400 is sprayed into the cavities formed by the first openings 220 of the first mask structure 200 and is cured before the first mask structure 200 is removed.

Our methods have been illustrated and described in more specific detail on the basis of preferred examples. Nevertheless, this disclosure is not restricted to the examples disclosed. Rather, other variations can be derived therefrom by those skilled in the art, without departing from the scope of protection of this disclosure or the appended claims.

This application claims priority of DE 10 2013 211 634.9, the disclosure of which is hereby incorporated by reference.

The invention claimed is:

1. A method of producing a conversion element comprising in this order:
    providing a substrate having a surface;
    forming a first mask structure on the surface, wherein the first mask structure has first webs and first openings arranged between the first webs and the first openings form cavities in which the surface of the substrate is accessible;
    arranging a second mask structure above the first mask structure, wherein the second mask structure has second webs and second openings arranged between the second webs, the first webs are at least partly covered by the second webs, and the cavities remain at least partly accessible through the second openings;
    spraying a material into the cavities through the second openings;
    removing the second mask structure;
    curing the material sprayed into the cavities; and
    removing the first mask structure.

2. The method as claimed in claim 1, wherein curing the material sprayed into the cavities is carried out by a thermal method.

3. The method as claimed in claim 1, further comprising detaching the conversion elements from the surface of the substrate, wherein the material sprayed into the cavities forms conversion elements.

4. The method as claimed in claim 3, wherein detaching the conversion elements is carried out by a transfer adhesive bonding process.

5. The method as claimed in claim 1, wherein the material sprayed in comprises a wavelength-converting phosphor.

6. The method as claimed in claim 1, wherein the first mask structure is formed from a resist.

7. The method as claimed in claim 6, wherein removing the first mask structure is carried out by dissolving the first mask structure by a solvent.

8. The method as claimed in claim 1, wherein the first mask structure comprises a plastics material or a metal.

9. The method as claimed in claim 8, wherein removing the first mask structure is carried out by pulling off.

10. The method as claimed in claim 1, wherein the second mask structure comprises a metal.

* * * * *